(12) United States Patent
Chang et al.

(10) Patent No.: US 7,355,427 B2
(45) Date of Patent: Apr. 8, 2008

(54) CLAMPING TOP PLATE USING MAGNETIC FORCE

(75) Inventors: Kyun-Jung Chang, Waterloo (CA); Arkady Ivannikov, Mississauga (CA); Marek Reksnis, Waterloo (CA)

(73) Assignee: Research in Motion Limited, Waterloo, ON ( * ) Notice: Subject to any disclaimer, the term of this patent is extended or adjusted under 35 U.S.C. 154(b) by 173 days.

(21) Appl. No.: 11/206,198

(22) Filed: Aug. 18, 2005

(65) Prior Publication Data

US 2007/0057681 A1    Mar. 15, 2007

(51) Int. Cl.
    *G01R 31/02*      (2006.01)
(52) U.S. Cl. .................... 324/758; 324/158.1
(58) Field of Classification Search ............. None
See application file for complete search history.

(56) References Cited

U.S. PATENT DOCUMENTS

| | | | | |
|---|---|---|---|---|
| 3,280,715 A | * | 10/1966 | Corl et al. ................. 355/85 |
| 4,975,637 A | * | 12/1990 | Frankeny et al. .......... 324/760 |
| 5,135,012 A | * | 8/1992 | Kamen et al. ............. 132/294 |
| 5,436,567 A | * | 7/1995 | Wexler et al. ............. 324/754 |
| 5,572,144 A | * | 11/1996 | Davidson et al. .......... 324/755 |
| 5,831,160 A | * | 11/1998 | Steketee .................... 73/431 |
| 6,509,754 B2 | * | 1/2003 | Lin et al. .................. 324/755 |
| 6,737,882 B2 | * | 5/2004 | Wood et al. ............... 324/765 |
| 2002/0074993 A1 | | 6/2002 | Boswell et al. |
| 2004/0226167 A1 | | 11/2004 | Tseng et al. |
| 2004/0257097 A1 | | 12/2004 | Beaucag et al. |

\* cited by examiner

*Primary Examiner*—Ha Tran Nguyen
*Assistant Examiner*—Richard Isla-Rodas
(74) *Attorney, Agent, or Firm*—Matthew M. Roy; Ogilvy Renault LLP (57) ABSTRACT

A test fixture, for testing an electronic device, includes: a test platform including electrically conductive contacts protruding from a device receiving surface in the test platform; a positioning guide disposed on the device receiving surface; a device retention cover; where the test platform includes a platform magnetic member and the retention cover includes a cover magnetic member, the platform magnetic member and the cover magnetic member being mutually magnetically attractive. A method of producing an electronic device including: preparing the test fixture, for testing the electronic device; placing the electronic device using the at least one device positioning guide disposed on the device receiving surface; and placing the device retention cover upon the electronic device to apply a force to the electronic device.

18 Claims, 7 Drawing Sheets

CLAMPING TOP PLATE USING MAGNETIC FORCE

TECHNICAL FIELD

An electronic component testing fixture positions and then clamps a component between a test bed platform and a manually removable clamping plate using magnetic attractive force.

BACKGROUND OF THE ART

The testing of electronic components or devices during manufacturing involves use of a test fixture to accurately position the device under test so that electrical contacts are properly engaged to perform the test. Inaccurate placement or lack of appropriate electrical contact could result in a false rejection of the device under test and significant waste.

For example, power contacts and control system contacts on circuit board devices are engaged with matching contacts on a test fixture by manually or mechanically placing the circuit board device on the test fixture. Guide pins or other physical barriers are located on the test bed to accurately guide and locate the device to be tested into the correct testing position.

In a circuit board device, the electrical contacts may be soldered, or engaged with tight fitting connectors, and the circuit boards are usually snap-locked, fastened or clamped securely in a housing to avoid malfunctions or short circuits in use.

However, in a test fixture, such secure means of making electrical contacts are inefficient and would interfere with the speed of testing required during manufacture. Test fixtures therefore include temporary means of making electrical contact which minimize the risk damage to the device under test and which aim to involve minimal time in positioning and withdrawing the devices under test to increase the speed of testing.

Since many electronic devices are very light weight and flexible, merely placing the devices in a test fixture is insufficient to ensure that proper electrical contact is made. Commonly the device is physically clamped to exert pressure on the matching electric contacts and ensure that a reliable connection is made for conducting the testing procedure.

Pneumatic, hydraulic or mechanical clamping systems, including robotic systems are commonly used for this clamping function. However, all such systems require physical space in the manufacturing facility, require maintenance due to inevitable wear and tear of moving parts, and require periodic adjustments to maintain accuracy, consume power, impose operating and capital costs, and often create significant noise or safety hazards. In many cases, the test fixture and associated clamping system must be housed within a protective housing such as a radio frequency housing, a noise suppression housing, a dust proof housing, a temperature controlled housing or other protected environments. The use of mechanical, pneumatic or hydraulic clamping systems significantly increases the necessary space volume of any protective enclosure consuming manufacturing space and imposing various costs on the manufacturing process.

DESCRIPTION OF THE DRAWINGS

In order that the subject matter may be readily understood, one embodiment of the subject matter is illustrated by way of example in the accompanying drawings.

Further details of the test fixture and its advantages will be apparent from the detailed description included below.

DETAILED DESCRIPTION OF PREFERRED EMBODIMENTS

There is provided a test fixture, for testing an electronic device, including: a test platform including electrically conductive contacts protruding from a device receiving surface in the test platform; a positioning guide disposed on the device receiving surface; a device retention cover; where the test platform includes a platform magnetic member and the retention cover includes a cover magnetic member, the platform magnetic member and the cover magnetic member being mutually magnetically attractive.

Further, there is provided a method of producing an electronic device including: preparing the test fixture, for testing the electronic device; placing the electronic device using the at least one device positioning guide disposed on the device receiving surface; and placing the device retention cover upon the electronic device to apply a force to the electronic device.

Figure 1:
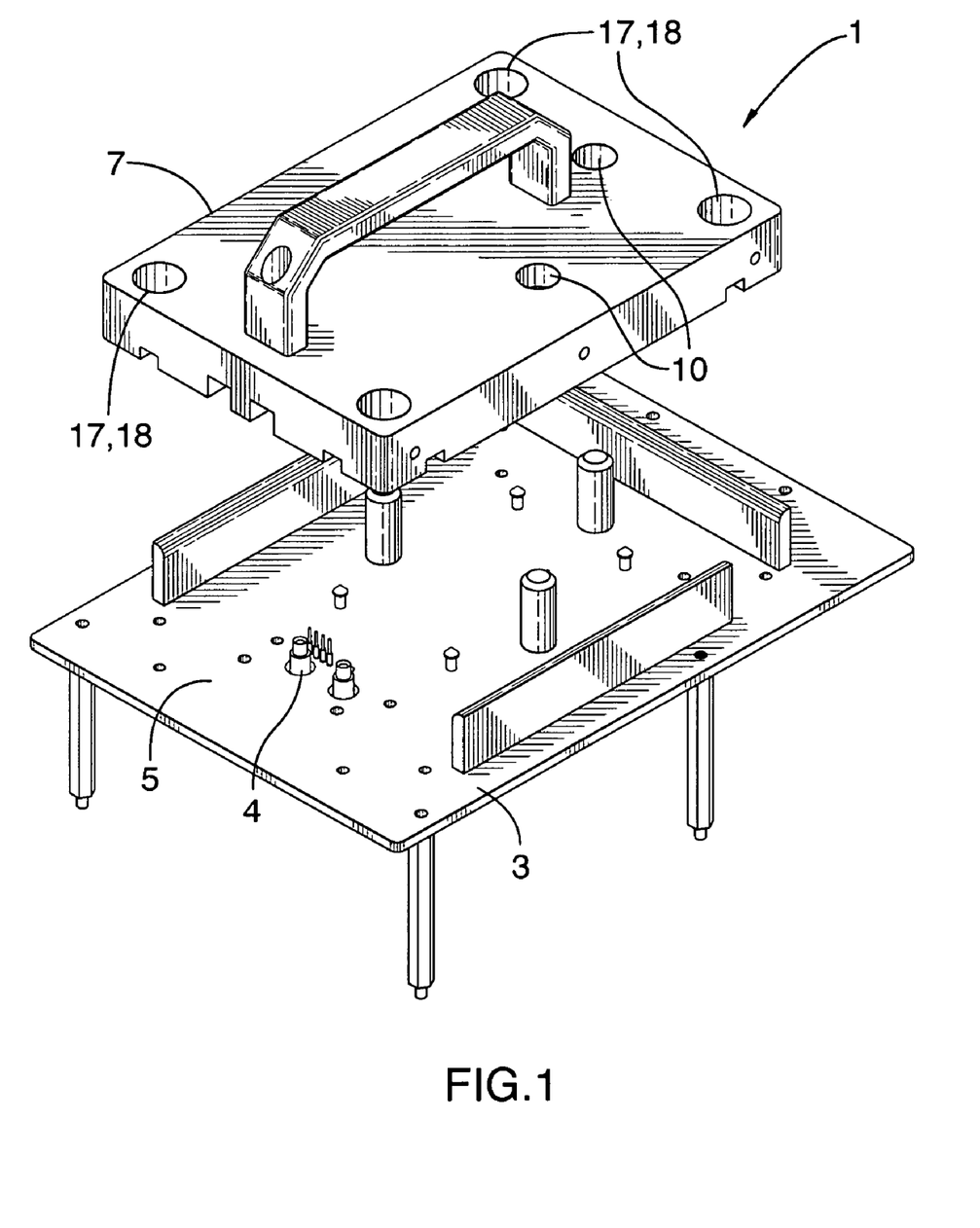
FIG. 1 is a top isometric view of one embodiment showing a test fixture with test platform with cylindrical pins as device positioning guides and at an elevated position a retention cover with manual grip handle having matching cylindrical recesses and having a cylindrical recess socket in each corner to house permanent corner.
Figure 2:
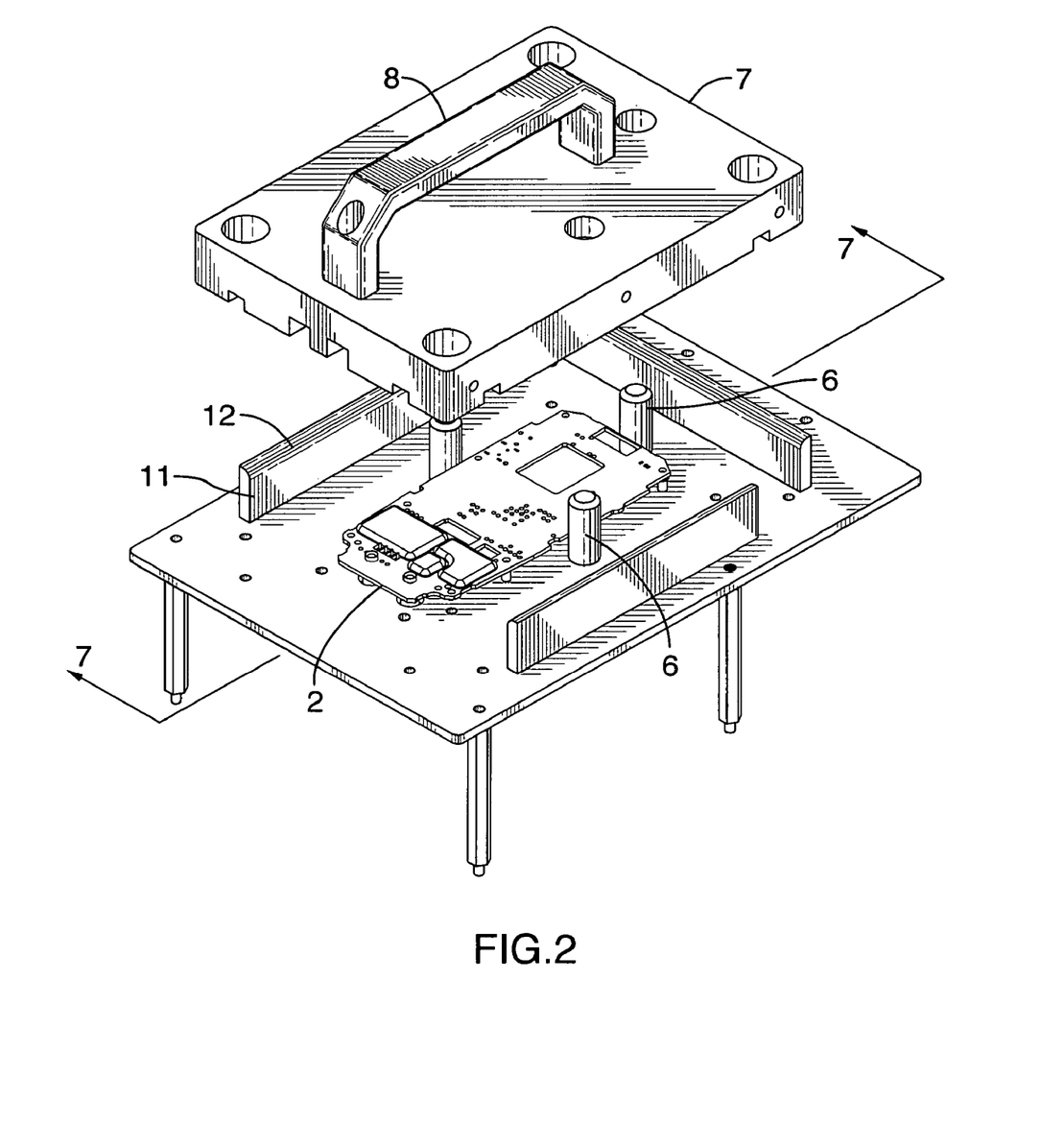
FIG. 2 is a like top isometric view showing an electronic device positioned on the electrically conductive contacts protruding from the test platform and aligned by the cylindrical pins serving as device positioning guides.

With reference to FIGS. 1 and 2, the test fixture 1 is provided for testing an electronic device 2 such as the illustrated circuit board for a wireless communication device.

The test fixture 1 includes a test platform 3 including electrically conducting contacts 4 (best seen in FIG. 1) which protrude from a device receiving surface 5 of the test platform 3.

Figure 3:
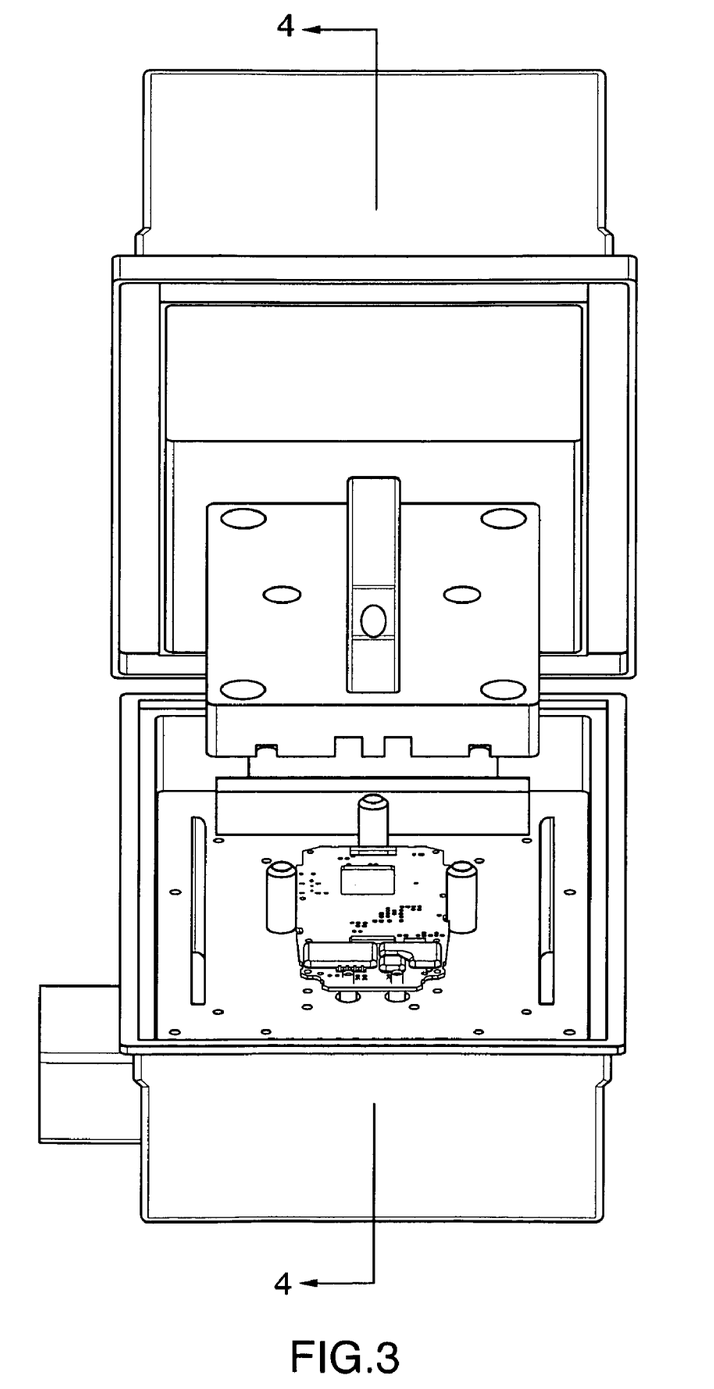
FIG. 3 is a front isometric view showing the electronic device for testing position within the test platform and showing containment housing with hinged lid surrounding the entire test platform.

As best seen in FIGS. 2 and 3, the test platform 3 includes device positioning guides 6 disposed on the device receiving surface 5. In the embodiment illustrated, the device positioning guides 6 comprise cylindrical pins. However, it will be understood that depending on the configuration of the electronic device 2, various other device positioning guides 6 can be provided such as planar members, shape conforming surfaces or rectangular protrusions for example.

It will also be understood that the test platform 3 can be easily reconfigured for various types of electronic devices 2 by removing the cylindrical pins 6 and relocating guides to different positions to accommodate different electronic devices 2.

Figure 6:
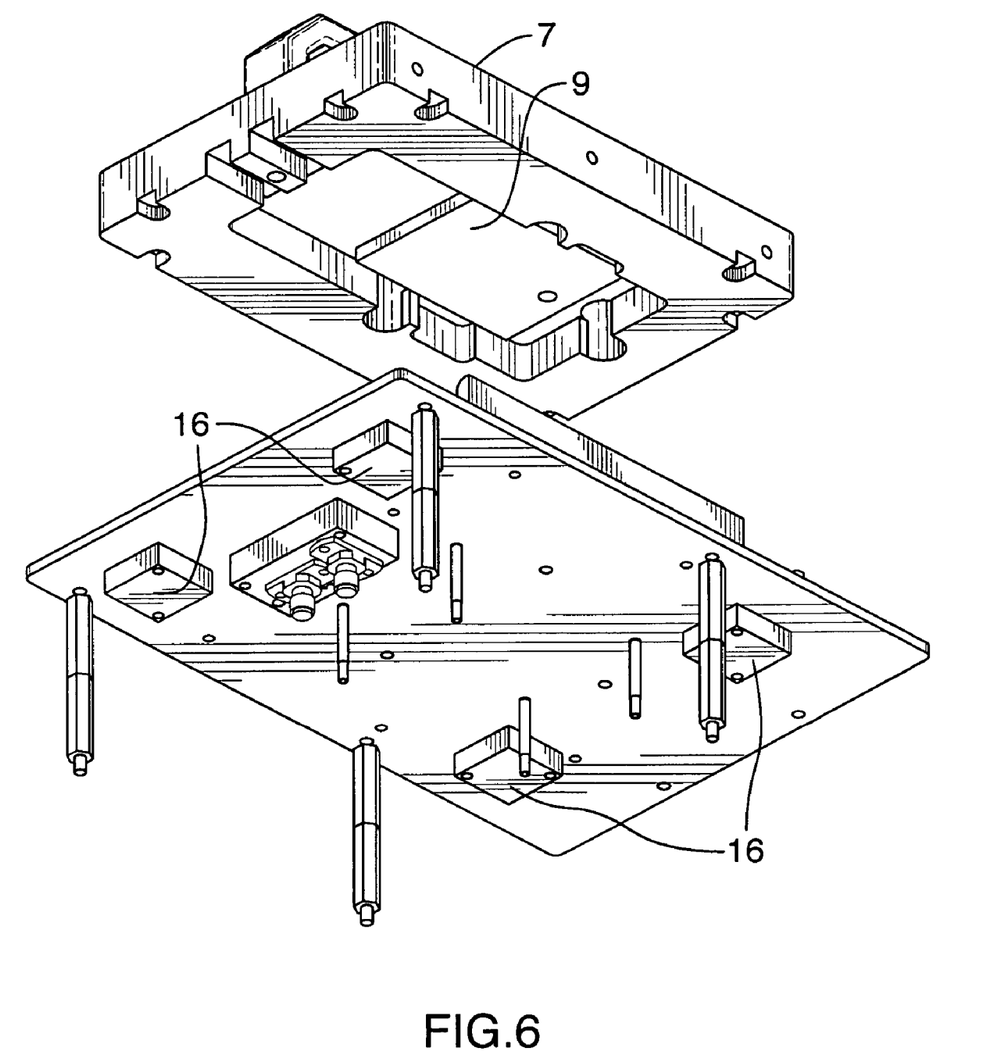
FIG. 6 is a bottom isometric view of the test fixture showing the bottom of the test platform with electrical contacts and platform magnetic members housed beneath the platform and showing the device retention cover with a receiving socket for receiving the electronic device therein.
Figure 7:
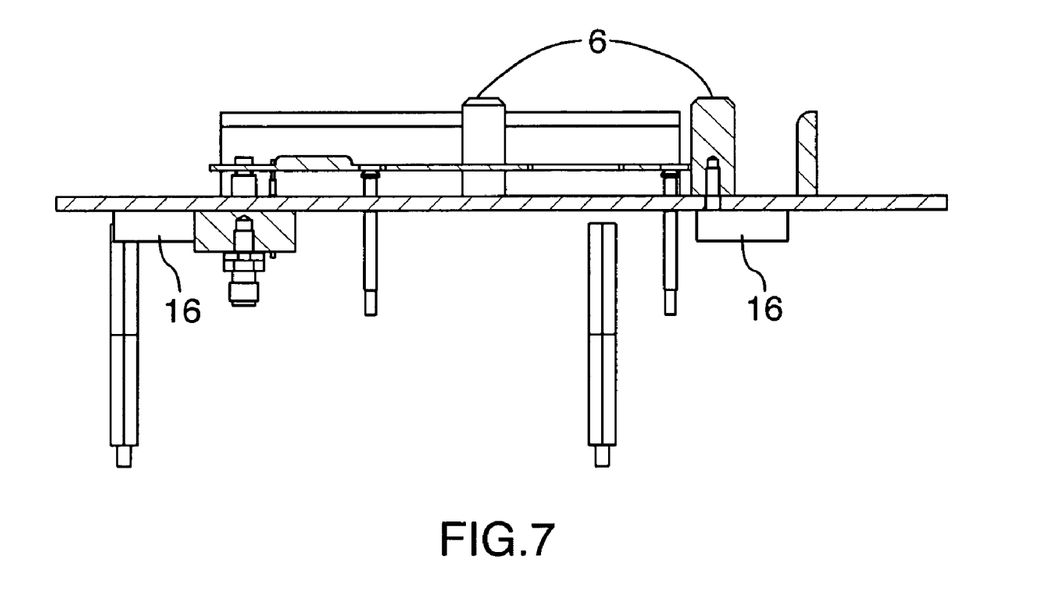
FIG. 7 is a detailed sectional view along lines 7-7 of FIG. 2.

The device retention cover 7 in the embodiment shown is a simple rectangular machined plate having a manual grip 8. As best seen in FIG. 6, the device retention cover 7 preferably includes a device receiving socket 9 that engages the device 2 and exerts a downward pressure to maintain adequate contact with the electrically conducting contacts 4.

The device retention cover 7 is manually positioned using cylindrical recesses 10 positioned to match the cylindrical pins 6. Further, to guide the cover 7, the test platform 3 includes three peripheral walls 11 disposed on the device receiving surface 5 each aligned with an outside edge of the retention cover 7 when the retention cover 7 is a covered position over the electronic device 2. To improve manual guiding of the cover 7, the peripheral wall 11 includes an inwardly chamfered cover guiding edge 12.

Figure 4:
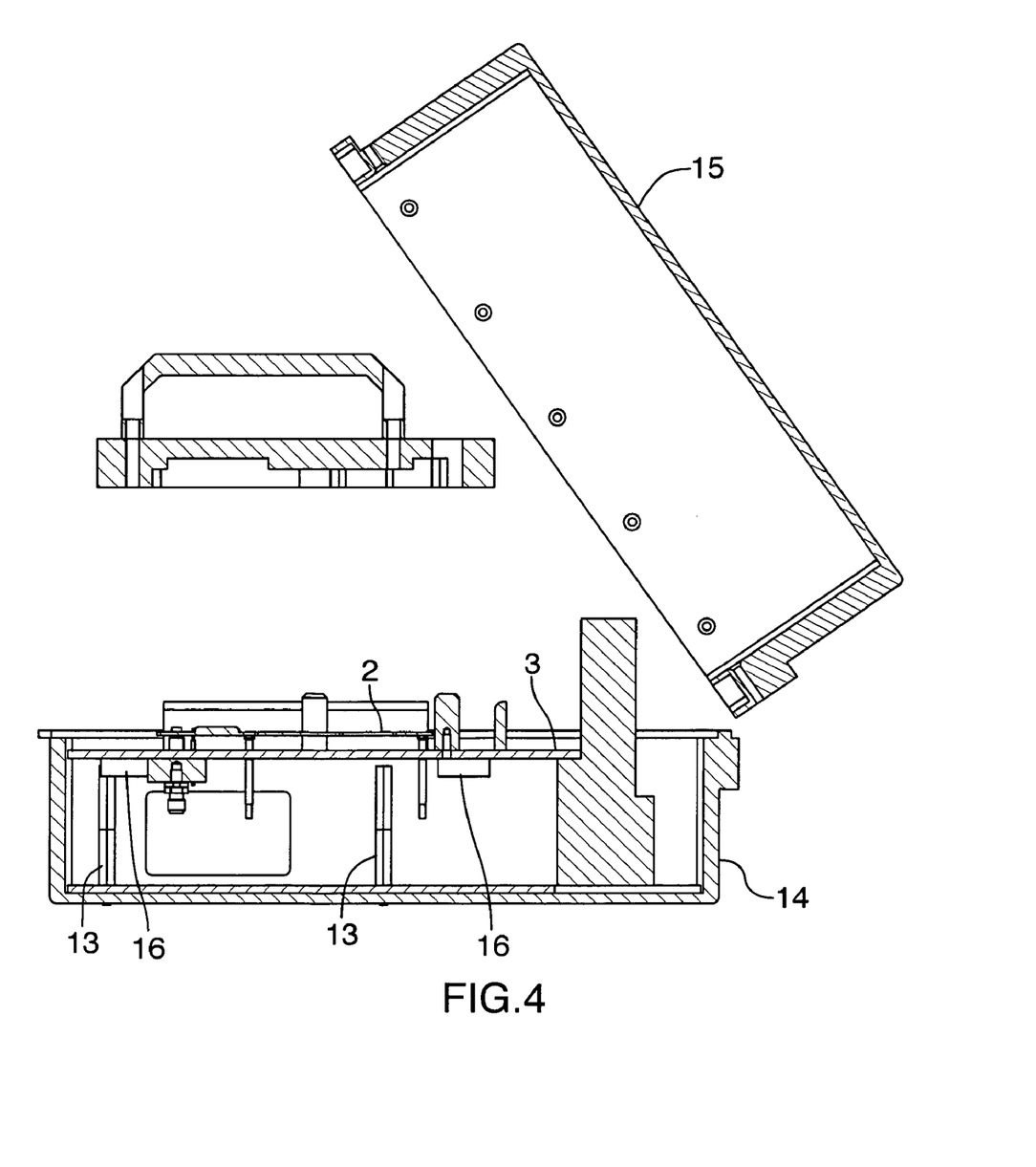
FIG. 4 is a vertical sectional view through the housing and test platform as indicated with lines 4-4 in FIG. 3.
Figure 5:
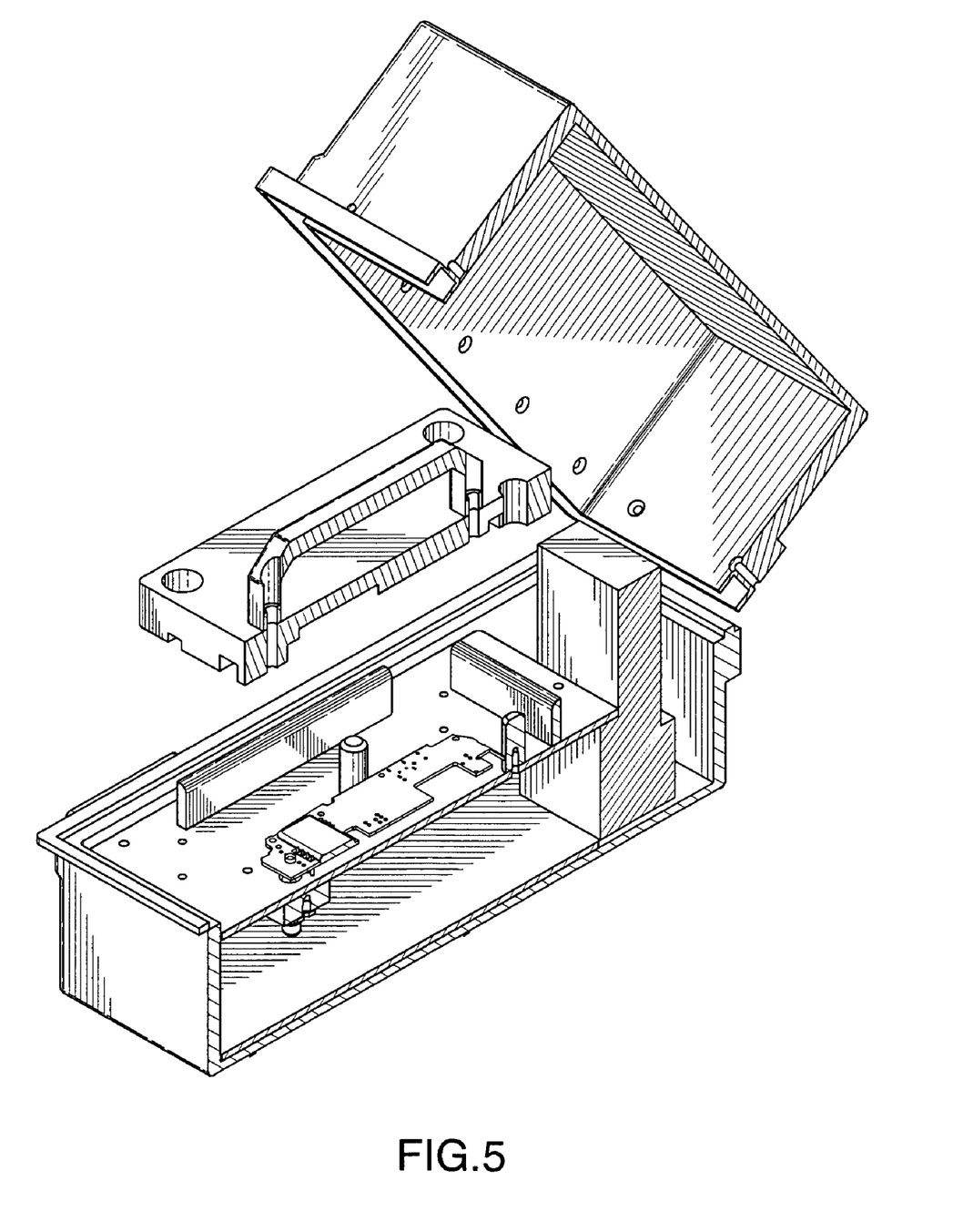
FIG. 5 is an isometric view along the same section shown in FIG. 4.

As shown in FIGS. 4 and 6, preferably the test platform 3 includes adjustable height removable support legs 13 and is housed within a container housing 14 with a hinged lid 15 for access. As illustrated, the support leg 13 provides adaptability to change the test fixture 1 for varying sizes of electronic devices 2 and the containment of housing 14 being a simple rectangular housing with hinged lid 15 can be adapted for various sizes and shapes of electronic devices 2 for testing. In one embodiment for example, the containment housing 14 comprises a radio frequency blocking enclosure. However, other protective environments can be provided in a like manner such as noise suppression housing, a dust proof housing or a temperature control housing.

Turning to FIGS. 1, 4 and 6, it can be seen that the test platform 3 includes a platform magnetic member 16 as illustrated in each of the four corners. The retention cover 7 likewise includes four cover magnetic members 17 are removably housed within a recess socket 18. It will be understood that in order to exert a clamping pressure on the electronic device 2, that the platform magnetic members 16 and the cover magnetic members 17 are mutually magnetically attractive. The degree of compressive force applied by the retention cover 7 can be easily modified by selecting appropriate permanent magnets for the platform magnetic member 16 and retention cover member 17.

The platform magnetic members 16 and retention cover magnetic members 17 are preferably mutually aligned on an axis normal to the test platform 3 as illustrated in the accompanying drawings. Alignment avoids any twisting of the cover 7 relative to the test platform 3 during installation and withdrawal.

As illustrated, the components of the test fixture 1 are preferably modular in design, easily removed and replaced in various positions. The modular design results in easy modification, flexibility and relative low cost. Compared to mechanical clamping systems, pneumatic or hydraulically actuated clamping devices, the test fixture 1 is low cost and small size having only one moving part, the cover 7, that is manually positioned. Wear and tear of the fixture 1, maintenance and calibration are substantially reduced if not completely eliminated. The manual operation will alert the person performing the test to any misalignment or malfunction. As a result, safe operation is ensured, the device requires less space than mechanically operating clamping devices, and will be longer lasting requiring little maintenance while remaining simple to modify for various manufacturing applications.

We claim:

1. A test fixture (1), for testing an electronic device (2), comprising:
    a test platform (3) including electrically conductive contacts (4) on a device receiving surface (5) thereof;
    a plurality of device-positioning guides (6) disposed on said device receiving surface (5) for positioning the electronic device (2) on the test platform (3); and
    a fully removable cover (7) having a plurality of recesses for mechanically engaging respective positioning guides for retaining the electronic device on the test platform (3),
    wherein the test platform (3) includes a platform magnetic member (16) and the fully removable cover (7) includes a cover magnetic member (17), the platform magnetic member (16) and the cover magnetic member (17) being mutually magnetically attractive.

2. A test fixture (1) according to claim 1 wherein at least one of the platform magnetic member (16) and the cover magnetic member (17) comprise a permanent magnet wherein the cover magnetic member (17) is removable housed within a recessed socket (18) formed in the fully removable cover (7).

3. A test fixture (1) according to claim 1 wherein the platform magnetic member (16) and the cover magnetic member (17) are mutually aligned on an axis normal to the test platform (3).

4. A test fixture (1) according to claim 1 wherein the device positioning guides (6) are cylindrical pins (6) for engaging cylindrical recesses formed in the fully removable cover.

5. A test fixture (1) according to claim 1 wherein the test platform (3) includes at least one cover alignment guide (11) disposed on said device receiving surface (5).

6. A test fixture (1) according to claim 5 wherein the at least one cover alignment guide (11) comprises a peripheral wall (11) aligned with an outside edge of the fully removable cover (7) in a covered position.

7. A test fixture (1) according to claim 6 wherein the peripheral wall (11) includes an inwardly chamfered cover guiding edge (12).

8. A test fixture (1) according to claim 1 wherein the fully removable cover (7) has a test platform facing surface with a device receiving socket (9).

9. A test fixture (1) according to claim 8 wherein the fully removable cover (7) has a manual grip (8).

10. A test fixture (1) according to claim 1 wherein the test platform (3) includes height-adjustable support legs (13) for supporting differently sized electronic devices (2).

11. A test fixture (1) according to claim 1 wherein the test platform (3) includes a containment housing (14).

12. A test fixture (1) according to claim 11 wherein the containment housing (14) comprises a radio frequency blocking enclosure.

13. A test fixture (1) according to claim 11 wherein the containment housing (14) has a hinged lid (15).

14. A method of testing an electronic device, the method comprising:
    preparing a test fixture (1), for testing the electronic device (2), the test fixture (1) having a test platform (3) including electrically conductive contacts (4) on a device receiving surface (5) thereof;
    positioning the electronic device (2) on the test platform (3) using a plurality of device positioning guides (6) disposed on said device receiving surface (5);
    placing fully removable cover (7) upon the electronic device (2) by aligning recesses in the fully removable cover with respective device positioning guides to apply a force to the electronic device (2), wherein the test platform (3) includes a platform magnetic member (16) and the fully removable cover (7) includes a cover magnetic member (17), the platform magnetic member (16) and the cover magnetic member (17) being mutually magnetically attractive.

15. A method according to claim 14 wherein the step of placing the electronic device (2) on said device receiving surface (5) is manually performed.

16. A method according to claim 14 wherein the step of placing the fully removable cover (7) upon the electronic device (2) to apply a force to the electronic device (2) is manually performed.

17. A method according to claim 14 wherein the test platform (3) includes a containment housing (14) with a hinged lid (15) and wherein the method includes the further step of closing the lid (15) after the step of placing the fully removable cover (7) upon the electronic device (2).

18. A method according to claim 14 further comprising a step of reconfiguring the test platform (3) by relocating guides (6) to different positions to accommodate different electronic devices (2).

* * * * *